(12) United States Patent
Pletzer et al.

(10) Patent No.: US 7,446,605 B2
(45) Date of Patent: Nov. 4, 2008

(54) AMPLIFIER ARRANGEMENT WITH CONTROLLABLE GAIN AND METHOD FOR CONTROLLING AN AMPLIFIER GAIN

(75) Inventors: Hans Pletzer, Linz (AT); Werner Schelmbauer, Linz (AT); Harald Pretl, Schwertberg (AT)

(73) Assignee: Infineon Technologies AG, Munich (DE)

( * ) Notice: Subject to any disclaimer, the term of this patent is extended or adjusted under 35 U.S.C. 154(b) by 80 days.

(21) Appl. No.: 11/528,254

(22) Filed: Sep. 27, 2006

(65) Prior Publication Data

US 2008/0074184 A1    Mar. 27, 2008

(51) Int. Cl.
*H03G 3/20* (2006.01)
(52) U.S. Cl. .................... 330/129; 330/136
(58) Field of Classification Search .......... 330/129, 330/136, 124 R, 295, 254, 278
See application file for complete search history.

(56) References Cited

U.S. PATENT DOCUMENTS

| 6,288,608 | B1 * | 9/2001 | Jadus et al. ............ 330/124 R |
| 6,636,114 | B2 * | 10/2003 | Tsutsui et al. ............... 330/51 |
| 6,798,287 | B2 * | 9/2004 | Wu et al. .................... 330/129 |
| 7,248,845 | B2 * | 7/2007 | Dunn ...................... 455/127.1 |
| 2005/0032499 | A1 | 2/2005 | Cho |

* cited by examiner

*Primary Examiner*—Henry K Choe
(74) *Attorney, Agent, or Firm*—Eschweiler & Associates, LLC

(57) ABSTRACT

An amplifier arrangement with controllable gain includes a first and a second amplifier device which each have a control input to receive a control signal to adjust a gain factor of the respective amplifier device. A control device is provided which is coupled to the second amplifier device to derive an effective gain factor of the second amplifier device as a function of the control signal. The control device further includes a control output coupled to the respective control inputs of the first and the second amplifier device to provide the control signal depending on a desired gain factor and the effective gain factor.

31 Claims, 4 Drawing Sheets

AMPLIFIER ARRANGEMENT WITH CONTROLLABLE GAIN AND METHOD FOR CONTROLLING AN AMPLIFIER GAIN

FIELD OF THE INVENTION

The invention relates to an amplifier arrangement with controllable gain and to a method for controlling an amplifier gain.

BACKGROUND OF THE INVENTION

A transmission path of a mobile communication system usually comprises an amplifier or multiple amplifier stages which can be adjusted regarding their output power. To this end such amplifiers which can also be called variable gain amplifiers, VGA, comprise a control input for adjusting a variable gain factor of the amplifier.

In many cases a fine tuning of the output power can be required within a wide output power range, especially in systems for modern mobile communication standards as universal mobile telecommunication standard, UMTS. For this purpose amplifiers with a gain factor which can be adjusted in an analogue way in response to an analogue control signal are widely used.

Although a small absolute change of the amplifier gain can be achieved using conventional amplifier arrangements, an effective gain factor of the amplifier arrangement can be dependent on the respective control signal in a non-linear way. Accordingly, a constant ratio between adjusted gain factor and provided control signal which corresponds to a constant slope of the amplifier arrangement is hard to achieve. However, a constant slope can be an important requirement for an exact power control of the amplifier arrangement. Furthermore, it is desirable that the slope of the amplifier is independent of the temperature or process variations.

In many cases amplifier arrangements comprising multiple amplifier stages are used in the transmission path to achieve the required wide output power range. Thereby it can be desirable to dimension the amplifier stages in such a way that a resulting gain of the multi-stage amplifier or a gain characteristic respectively is linearly dependent on a control signal. Deviations of single amplifier stages because of, for example, process or temperature variations can influence the gain characteristic. This again can result in the effect that a desired linear dependence can not or not any longer be achieved.

In conventional amplifier arrangements this issue can for example be addressed with inductive feedback or degeneration. Another possibility to reduce a variation of the gain characteristic is to provide a control arrangement that controls an amplifier or an amplifier stage to maintain a desired current at a desired operating point of the amplifier. Nevertheless deviations of the slope of the gain characteristic can occur using these measures as the gain characteristic is dependent on other factors, too.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

According to one embodiment of the invention an input signal difference is provided to an auxiliary amplifier device which may be a scaled or substantially similar copy of a main amplifier device. This results in an output signal difference which can be measured. From the given input signal difference and the measured output signal difference an effective gain factor of the auxiliary amplifier device is derived.

The effective gain factor depends on a control signal which is also provided to the main amplifier device. Therefore the gain factor of the auxiliary amplifier device corresponds to the effective gain factor of the main amplifier device. The control signal can be adjusted or adapted to achieve a desired gain factor for both the auxiliary and the main amplifier device. The adapted gain factor can also be provided to a plurality of amplifier devices which advantageously have the same structure and/or are operated at the same operating point. Although in the embodiments described above, DC-signals are used as input signals for the auxiliary amplifier device, the measurement of the effective gain factor could be performed with AC-signals.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

The invention is explained in detail below using exemplary embodiments with reference to the drawing, in which.

DETAILED DESCRIPTION OF THE INVENTION

Figure 1:
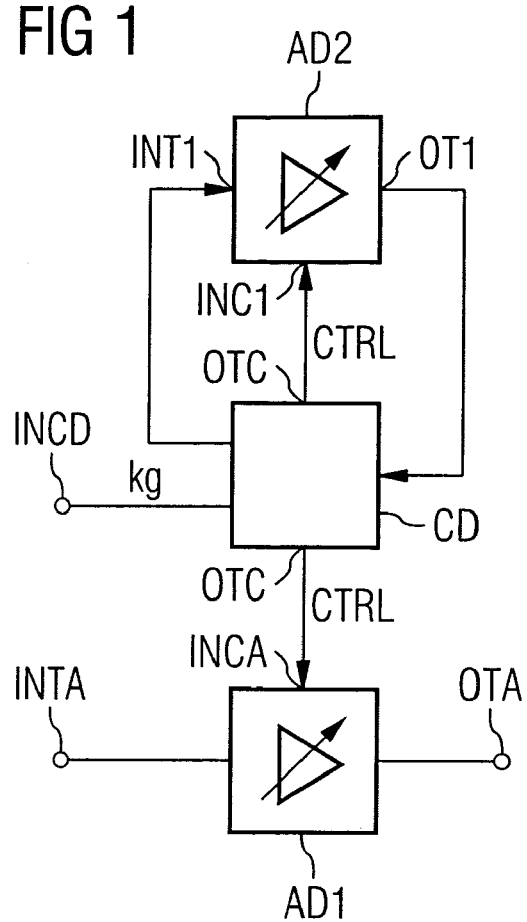
FIG. 1 is a block diagram illustrating a first exemplary embodiment of an amplifier arrangement.

In the following description further aspects and embodiments of the present invention are summarized. In addition, reference is made to the accompanying drawings, which form a part hereof, and in which is shown by way of illustration, in which the invention may be practiced. The embodiments of the drawings present a summary in order to provide a better understanding of one or more aspects of the present invention. This summary is not an extensive overview of the invention and neither intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

FIG. 1 shows a first exemplary embodiment of an amplifier arrangement according to the invention. The amplifier arrangement comprises a first amplifier device AD1 with a first signal input INTA and a first signal output OTA. The first amplifier device AD1 comprises a first control input INCA to receive a control signal CTRL for adjusting a gain factor of the first amplifier device AD1.

The control signal CTRL is provided by a control device CD on its control output OTC. The control device CD further comprises a control input INCD for providing a desired gain factor kg.

A second amplifier device AD2 is provided comprising a control input INC1 which is coupled to the control output OTC of the control device CD for receiving the control signal CTRL. The second amplifier device AD2 is further coupled to the control device CD with a second signal input INT1 and a second signal output OT1.

The first and the second amplifier device AD1, AD2 are each provided to amplify an input signal at their signal inputs INTA, INT1 and provide an amplified output signal at their respective signal outputs OTA, OT1.

The second amplifier device AD2 can have the same structure as the first amplifier device AD1. The second amplifier device AD2 can further be a scaled version or copy of the first amplifier device AD1. In this case a gain characteristic of the first and the second amplifier device AD1, AD2 corresponds to each other. Moreover, the first and the second amplifier stage AD1, AD2 each can comprise multiple cascaded amplifier stages.

The control device CD provides an auxiliary input signal to the second signal input INT1 of the second amplifier device AD2. The auxiliary input signal is amplified by the second amplifier device AD2 with a gain factor depending on the control signal CTRL and an auxiliary output signal is provided at the second signal output OT1. The control device CD measures an effective gain factor of the amplification performed by the second amplifier device AD2 as a function of the auxiliary input signal and the auxiliary output signal. The control device CD adapts the control signal CTRL depending on the measured effective gain factor and the desired gain factor kg provided at its control input INCD. As the control signal CTRL is also provided to the first amplifier device AD1, a main input signal at the first signal input INTA is amplified by the first amplifier device AD1 depending on the adapted control signal.

Therefore a desired gain factor kg is not directly provided to a main amplifier device which in this example would be the first amplifier device AD1 as in a conventional amplifier arrangement but to the control device CD which derives an adapted control signal CTRL depending on the desired gain factor kg. The measuring of the effective gain factor of the second amplifier device AD2 gives an indicator for adapting the control signal CTRL such that the effective gain factor and the desired gain factor correspond to each other. As a result, a constant gain factor of the main amplifier device AD1 and therefore a gain characteristic with a constant gain slope can be achieved.

Figure 2:
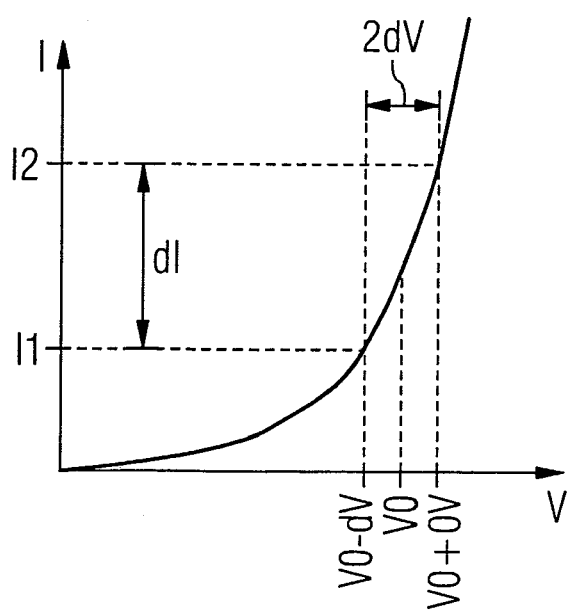
FIG. 2 is a graph illustrating an exemplary characteristic curve of a transistor amplifier.

FIG. 2 shows an exemplary characteristic curve of a transistor amplifier with an output current I depending on an input voltage V. A gain factor of the transistor amplifier for a specific operating point for example by the input voltage V0 is proportional to the ratio of an output current difference dI and an input voltage difference 2dV. The output current difference dI corresponds to a first output current I1 for an input voltage V0−dV and a second output current I2 for an input voltage V0+dV. As can be seen from FIG. 2, an effective gain factor does not only depend on an absolute value of the output current but also on an output signal difference in conjunction with a specific operating point.

Therefore the control device CD in FIG. 1 in one embodiment can vary the auxiliary input signal by an input signal difference and measure a resulting output signal difference of the auxiliary output signal depending on the input signal difference. The control signal can be adapted depending on the measured output signal difference and a desired output signal difference which corresponds to the given desired gain factor kg. The invention is not limited to the characteristic curve shown in FIG. 2 which is given as an example only. Also in other cases and for other characteristic curves an effective gain factor of an amplifier device corresponds to a ratio between an output signal difference and an input signal difference and in some cases on an effective operating point. All such variations are contemplated as falling within the scope of the invention.

Figure 3:
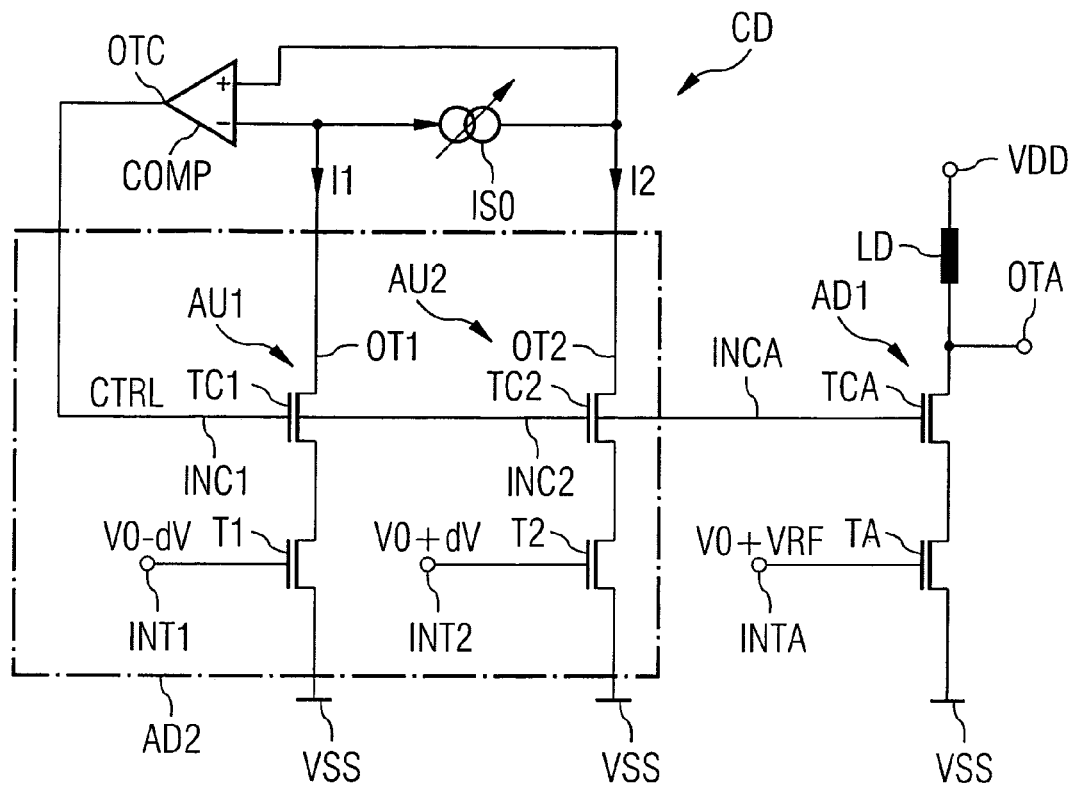
FIG. 3 is a schematic diagram illustrating a second exemplary embodiment of an amplifier arrangement.

FIG. 3 shows a further exemplary embodiment of an amplifier arrangement according to the invention. The first amplifier device AD1 comprises a series connection of a load LD, a control or cascode transistor TCA and a main transistor TA. The series connection is coupled between a supply voltage connector VDD and a reference voltage connector VSS. The first signal output OTA is coupled to a connection node between the load LD and the transistor TCA. The control input of the transistor TCA forms the first control input INCA and is coupled to the control output OTC of the control device CD. An input signal V0+VRF can be provided to the transistor TA via the first signal input INTA. VRF can be a radio frequency signal which is combined with a voltage V0 determining an operating point of the transistor TA and the first amplifier device AD1.

The second amplifier device AD2 comprises a first amplifier unit AU1 with a series connection of a control or cascode transistor TC1 and a transistor T1. The second amplifier device AD2 further comprises a second amplifier unit AU2 with a control or cascode transistor TC2 and a transistor T2. The first and the second amplifier unit AU1, AU2 both have the same structure as the amplifier device AD1 and can be scaled versions thereof. Their control inputs INC1, INC2 are coupled to the control output OTC.

The control device CD comprises an comparator COMP with an inverting input (−) coupled to the signal output OT1 of the first amplifier unit AU1 and a non-inverting input (+) coupled to the signal output OT2 of the second amplifier unit AU2. The control device CD further comprises a current source IS0 which is adjustable and whose current value corresponds to a desired output signal difference or to a desired gain factor respectively.

At the signal inputs INT1, INT2 which form the second signal input of the second amplifier device AD2 input signals V0−dV and V0+dV respectively are provided. In other words, an input signal comprising an input signal difference 2dV is provided to the second amplifier device AD2. This results in a first output signal corresponding to the output current I1 and a second output signal corresponding to the output current I2. The first and the second output currents form an output signal of the second amplifier device AD2 comprising an output signal difference. So to speak, auxiliary input signals V0−dV and V0+dV are amplified and auxiliary output signals are measured concurrently in this embodiment.

With the current source IS0 coupled between the non-inverting and the inverting inputs (+, −) of the comparator COMP the output signal difference is compared to the desired output signal difference provided by the current source IS0. The control signal CTRL is adapted according to the comparison result. The adapted control signal CTRL comprises a cascode voltage which is provided to the cascode transistors TC1, TC2, TCA of the first and the second amplifier device AD1, AD2 for adjusting the gain factor of the respective amplifier devices AD1, AD2. In other words, the cascode transistors TC1, TC2, TCA form cascode stages controlled by the control signal CTRL.

The input signals V0−dV and V0+dV for the first and the second transistor T1, T2 which are a function of the voltage V0 and determine an operating point of the first amplifier device AD1 can also be provided by the control device CD.

Figure 4:
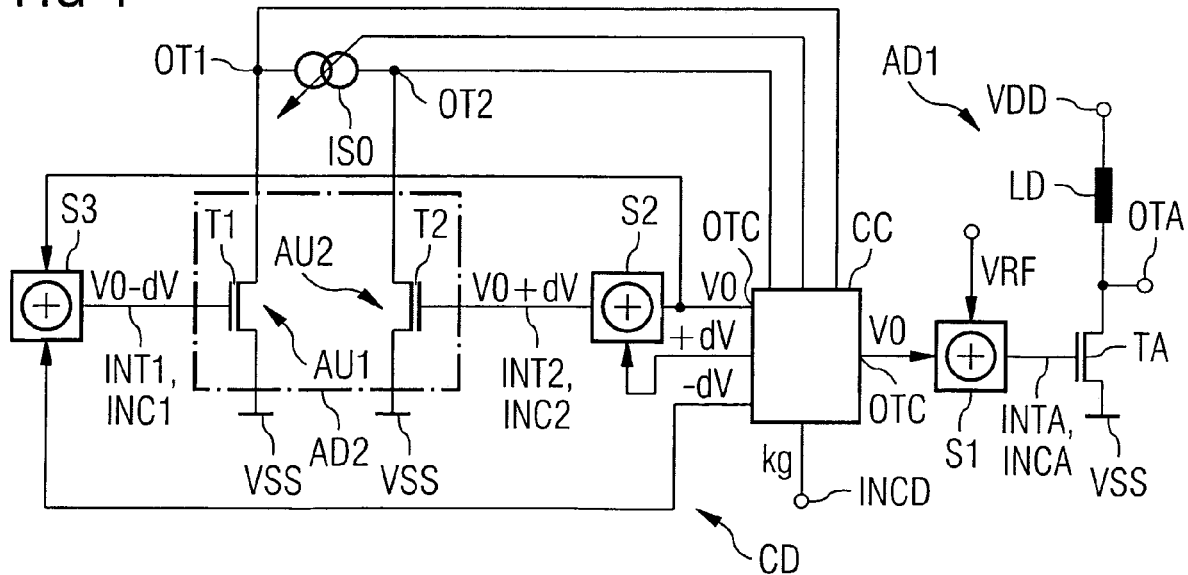
FIG. 4 is a schematic diagram illustrating a third exemplary embodiment of an amplifier arrangement.

FIG. 4 shows another embodiment of an amplifier arrangement according to the invention. In this embodiment a control circuit CC of the control device CD provides the control signal as a voltage V0 corresponding to an operating point of a transistor TA of the first amplifier device AD1. A summation device S1 is provided for adding a radio frequency signal VRF to the control voltage V0. The output of the summation element S1 is provided to the control input of the transistor TA which both forms the first signal input INTA and the first control input INCA of the first amplifier device AD1. The second amplifier device AD2 comprises a differential amplifier formed by the first and the second amplifier unit AU1, AU2. The control input of the transistor T1 both forms the signal input INT1 and the control input INC1. Accordingly, the control input of the second transistor T2 forms the signal input INT2 and the control input INC2.

The signal outputs OT1, OT2 of the second amplifier device AD2 are coupled to the control circuit CC. Like in the previous embodiment, a current source IS0 coupled between the signal outputs OT1, OT2 is provided for measuring an output signal difference of the differential output signal. A current value of the current source IS0 can be adjusted by the control circuit CC, for example depending on a desired gain factor kg or a desired output signal difference corresponding to the desired gain factor kg.

The control device CD provides a differential input signal to the second amplifier device AD2. Therefore a voltage difference +dV is added to the control voltage V0 by a summation element S2 and a corresponding negative or inverted voltage difference −dV is added to the control voltage V0 by a summation element S3. Thus a voltage V0−dV is provided to the transistor T1 and a voltage V0+dV is provided to the transistor T2 concurrently, resulting in an input signal difference of 2dV. By concurrently measuring the output signals of the second amplifier device AD2 an output signal difference can be determined.

The control circuit CC is configured to derive an effective gain factor of the second amplifier device AD2 as a function of the input signal difference and the output signal difference. The control signal or control voltage V0 respectively can be adapted depending on the measured effective gain factor and the desired gain factor kg. In other words, the control signal provided by the control device comprises a signal determining an operating point of transistors comprised by the respective first and second amplifier device AD1, AD2.

To avoid a possible gain mismatch resulting from a mismatch of the transistors in the first and the second amplifier unit AU1, AU2, in an alternative embodiment the signal inputs INT1, INT2 and the signal outputs OT1, OT2 of the embodiments shown in FIGS. 3 and 4 can be interchanged periodically, for example depending on a clock signal. In other words, the amplifier units AU1, AU2 are provided with a respective input signal, alternately higher and lower than the input signal determining the operational point of the first amplifier device AD1. At the same time the signal outputs OT1, OT2, providing the differential output signal, are exchanged to receive the respective output signal difference. The resulting control signal CTRL can be seen as an average value for the first and the second amplifier unit AU1, AU2. The control signal CTRL is determined by chopping the differential input and output signals of the first and the second amplifier unit AU1, AU2.

Figure 5:
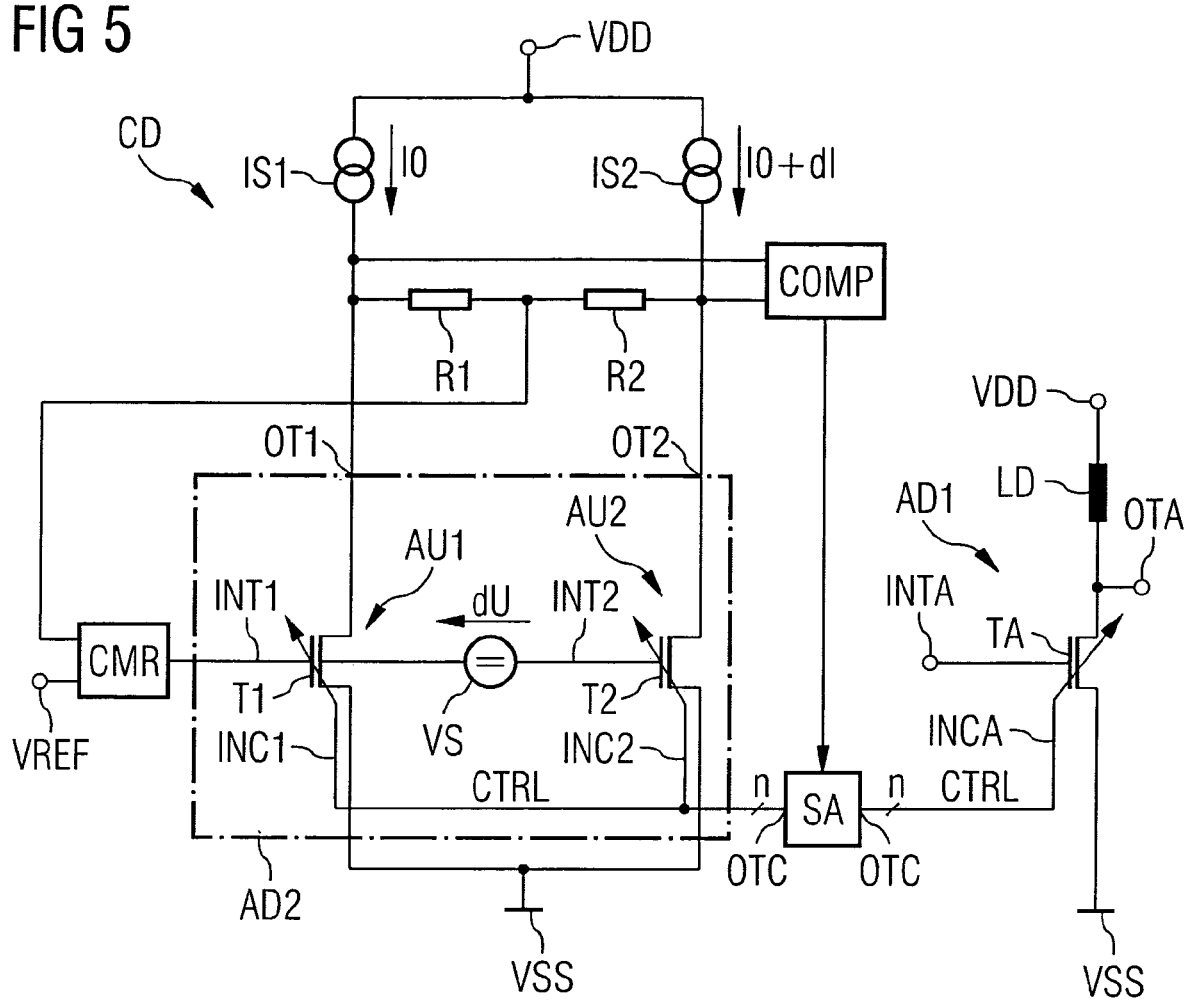
FIG. 5 is a schematic diagram illustrating a fourth exemplary embodiment of an amplifier arrangement.
Figure 6:
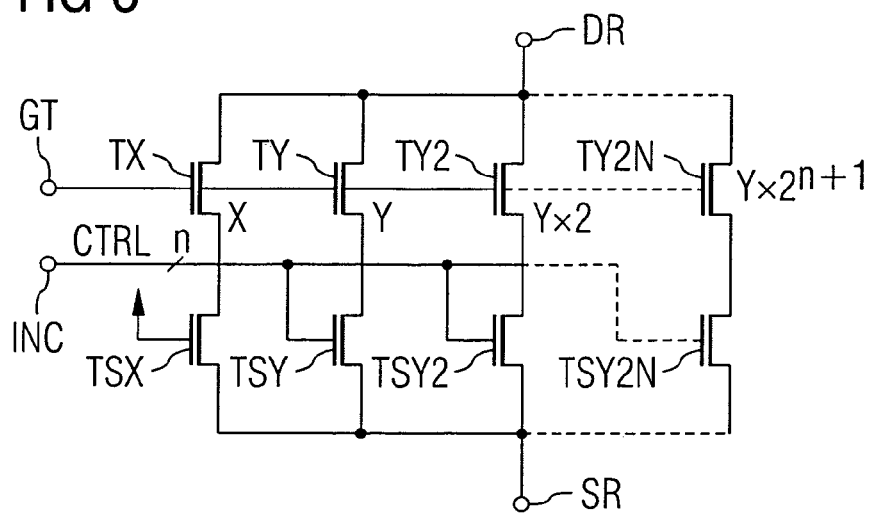
FIG. 6 is a schematic diagram illustrating an embodiment of a switchable amplifier device.

In another embodiment of an amplifier arrangement shown in FIG. 5 the first and the second amplifier device AD1, AD2 comprise transistors T1, T2, TA which have a switchable channel width to channel length ratio to influence the gain factor of the respective transistor. FIG. 6 shows an exemplary embodiment for the switchable transistors T1, T2, TA, however, other structures or subcircuits may be employed and are contemplated as falling within the scope of the invention.

The structure presented in FIG. 6 comprises a signal input GT corresponding to a gate connector of the transistors T1, T2, TA shown in FIG. 5. It further comprises connectors DR, SR corresponding to a drain and a source connector of the transistors T1, T2, TA shown in FIG. 5 respectively. Between each of the connectors DR, SR a series connection of a transistor TX, TY, TY2, TY2N and a transistor TSX, TSY, TSY2, TSY2N are connected in parallel, respectively. The gate connectors of the transistors TX, TY, TY2, TY2N are all connected to the signal input GT.

The signal paths of the series connections TY, TSY, TY2, TSY2 and TY2N, TSY2N can be switched on or off independently depending on the control signal CTRL which is provided as a digital control word, which for example has a word length of n-bits for switching n transistors TSY, TSY2, TSY2N digitally on or off. The transistor TSX is in a fixed on-state.

Thus by switching on or off the transistors TY, TY2, TY2N using the transistors TSY, TSY2, TSY2N the channel width to channel length ratio of the shown structure can be changed according to the individual channel width to channel length ratio of the transistors TY, TY2, TY2N. In other words, the transistors TY, TY2, TY2N form a set of switchable transistors. By changing the channel width to channel length ratio of the structure its effective gain factor can be changed.

In one exemplary embodiment, the ratio of the transistors TY, TY2, TY2N represents a binary weighting, so that the ratio of the respective transistors differs by a factor of 2. For example, the transistor TX represents a base ratio of X, the transistor TY represents a ratio of Y, the transistor TY2 represents a ratio of 2Y and so on until the transistor TY2N represents a ratio of $2^{n-1}Y$.

In another embodiment the transistors TY, TY2, TY2N can represent an equal weighting and can be switched on or off in response to a thermometer coded digital control word.

Referring again to FIG. 5, the control device CD comprises a device SA for providing the digital control word CTRL to the transistors T1, T2, TA. The transistors T1, T2 may have the same structure as the transistor TA but can be scaled versions thereof. The signal input INT1, INT2 of the transistors T1, T2 are coupled to a common mode circuit CMR for providing an input signal corresponding to an operating point of the transistor TA. A voltage source VS is connected between the signal inputs INT1, INT2 to generate an input signal difference DU for the transistors T1, T2. Two current sources IS1, IS2 provide currents I0, I0+dI respectively, with dI being a desired output signal difference. In other words, input signal difference DU and output signal difference dI correspond to an effective gain factor.

The common mode circuit CMR is coupled to a reference input VREF with a first input and to the signal outputs OT1, OT2 via the resistors R1, R2 with a second input. The first and the second signal output OT1, OT2 are further coupled to a comparator device COMP for comparing the output signals of the transistors T1, T2. The comparison result is provided to the device SA which adjusts the control signal CTRL in such a way that in one embodiment a voltage at the signal outputs OT1, OT2 is near to a zero crossing. To this end the device SA can use a digital algorithm, for example according to the principle of successive approximation. The device SA adapts the control word CTRL until the slope of the switchable transistors T1, T2 corresponds to the desired gain factor. Thereby the accuracy of the effective gain factor depends on the resolution of the quantization of the switchable transistors.

In this example the operating point of the transistor T2 is changed with respect to the operating point of the transistor TA by the input signal difference dU and the output signal difference dI. In another embodiment the operating point of the transistor T1 and the transistor T2 could be changed alternately. The digital control word CTRL can be derived as a mean value between changing the operating point for the transistor T1 and changing the operating point for the transistor T2.

The adapted digital control word CTRL is provided to the control input INCA of the switchable transistor TA to achieve the desired gain factor.

In another embodiment the switchable transistors T1, T2, TA could be replaced by programmable gain amplifiers wherein the amplifiers in the second amplifier device AD2 could be a scaled version of the main programmable gain amplifier in the first amplifier device AD1. Thus the digital control word is used to control a gain of the amplifier devices in discrete steps. Accordingly, a control word could be derived corresponding to a desired gain factor by varying an input signal by desired input signal difference and varying an output signal by a desired output signal difference.

Figure 7:
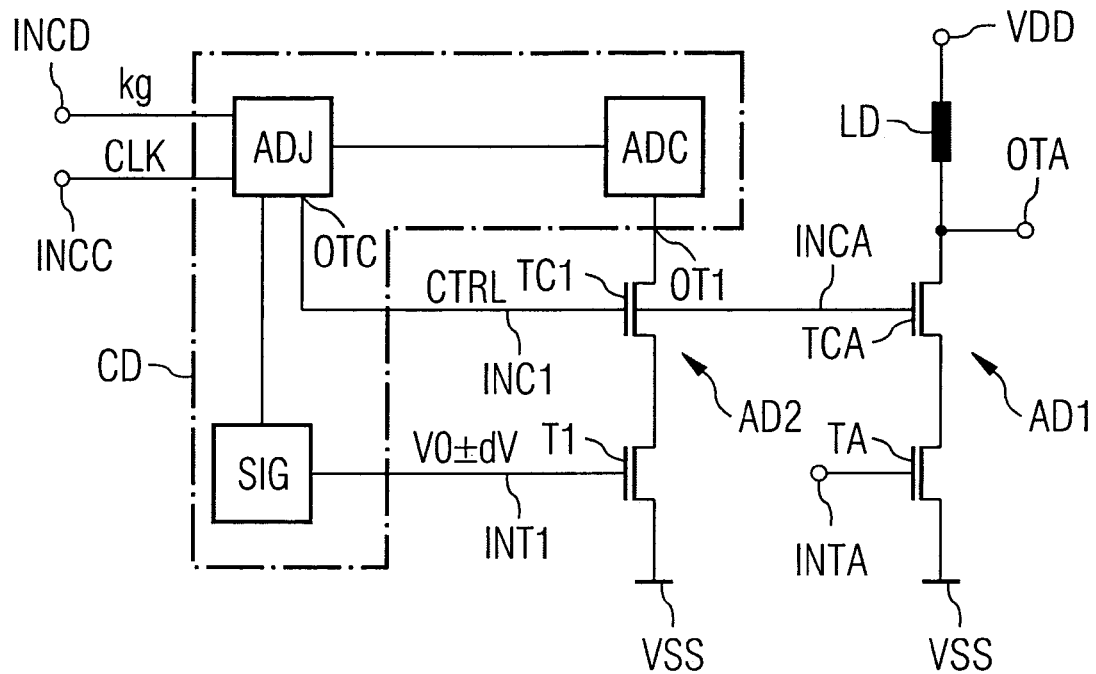
FIG. 7 is a schematic diagram illustrating a fifth exemplary embodiment of an amplifier arrangement.

FIG. 7 shows another embodiment of an amplifier arrangement. In this arrangement the first and the second amplifier device AD1, AD2 each comprise a signal transistor TA, T1 and a cascode transistor TCA, TC1. The control device CD comprises an analog-digital-converter ADC which is coupled to the signal output OT1 of the second amplifier device AD2 on its input side for measuring an auxiliary output signal. The control device CD further comprises an adjustment device ADJ which is coupled to the analog-digital-converter ADC and which comprises the control output OTC for providing the control signal CTRL as a cascode voltage at the control inputs INCA, INC1 of the first and the second amplifier device AD1, AD2.

A signal generator SIG for providing auxiliary input signals V0±dV to the signal input INT1 of the second amplifier device AD2 is also comprised by the control device CD. The adjustment device ADJ comprises an input INCD for receiving a desired gain factor kg, a clock input INCC for receiving a clock signal CLK and an output coupled to the signal generator SIG.

For determining the effective gain factor of the second amplifier device AD2 a first input signal V0+dV, provided by the signal generator SIG, is amplified during a first period. During a second period a second input signal V0−dV, also provided by the signal generator SIG, is amplified. The second input signal V0−dV differs from the first input signal V0+dV by an input signal difference 2dV. The amplification is dependent on the control signal CTRL provided by the adjustment device ADJ. The analog-digital-converter ADC measures a first output signal during the first period and a second output signal during the second period and provides the measured digital values to the adjustment device ADJ. In the adjustment device ADJ an output signal difference between the first and the second output signal is determined and the effective gain factor depending on the input signal difference 2dV and the determined output signal difference is derived or calculated respectively. The control signal CTRL is adapted depending on the effective gain factor and the desired gain factor kg.

Figure 8:
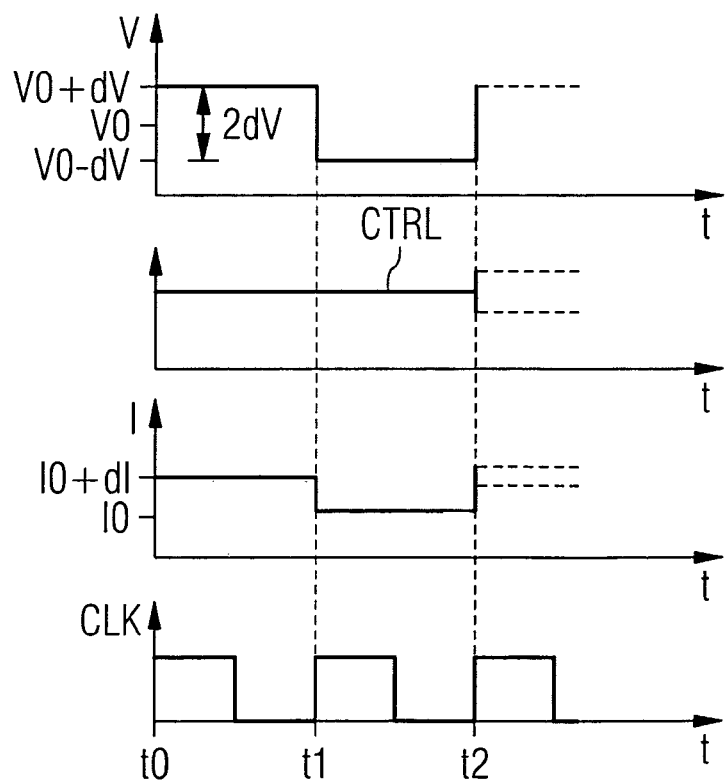
FIG. 8 is a timing diagram of the exemplary amplifier arrangement according to FIG. 7.

FIG. 8 shows an exemplary timing diagram of an amplifier arrangement according to the embodiment shown in FIG. 7. In the upmost graph a varying input signal voltage V is provided by the signal generator SIG. During a first period t0 to t1 an input signal voltage corresponding to V0+dV is provided as a first input signal and amplified. During a second period t1 to t2 a second input signal corresponding to V0−dV is amplified by the second amplifier device AD2. The control signal CTRL is provided as a constant signal during the first and the second period t0 to t2. The first period t0 to t1 and the second period t1 to t2 are derived from the clock signal CLK. The first and the second input signal differ by the signal input difference 2dV.

The output signal is measured as an output signal current I. During the first period t0 to t1 a first output signal corresponding to I0+dI and, during the second period t1 to t2, a second output signal corresponding to I0 is measured. Depending on the input signal difference 2dV and the measured output signal difference dI the effective gain factor is derived and the control signal CTRL is adapted accordingly.

Depending on the desired gain factor kg, the control signal CTRL is increased or decreased which results in a change of the output signal current I in a further period starting from t2. The providing of the varying input signal and the measuring of the resulting output signal can be continued accordingly.

According to one embodiment of the invention an input signal difference is provided to an auxiliary amplifier device which may be a scaled or substantially similar copy of a main amplifier device. This results in an output signal difference which can be measured. From the given input signal difference and the measured output signal difference an effective gain factor of the auxiliary amplifier device is derived.

The effective gain factor depends on a control signal which is also provided to the main amplifier device. Therefore the gain factor of the auxiliary amplifier device corresponds to the effective gain factor of the main amplifier device. The control signal can be adjusted or adapted to achieve a desired gain factor for both the auxiliary and the main amplifier device. The adapted gain factor can also be provided to a plurality of amplifier devices which advantageously have the same structure and/or are operated at the same operating point. Although in the embodiments described above, DC-signals are used as input signals for the auxiliary amplifier device, the measurement of the effective gain factor could be performed with AC-signals.

According to an embodiment, the auxiliary amplifier device comprises two structures corresponding to the main amplifier device for providing the input signal difference and measuring the output signal difference concurrently. According to an alternative embodiment, it is also possible that the auxiliary amplifier device comprises only one structure corresponding to the main amplifier device for measuring the output signal difference in timed or clocked operations.

The control signal can be adapted according to a varying desired gain factor but also to a constant desired gain factor.

The adaptation of the control signal can be performed continuously or only at certain instants, for example at a start-up of the amplifier arrangement. The adaptation of the control signal may also be switched off during an energy efficient power save mode of the amplifier arrangement.

The present invention can be used both for amplifier arrangements controlled by analogue or digital control signals and is independent of the effective amplifier structure used in the respective amplifier devices.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. An amplifier arrangement with controllable gain, comprising:
    a first amplifier device configured to amplify an input signal based on a gain factor thereof, comprising a first control input configured to receive a control signal to adjust the gain factor of the first amplifier device;
    a second amplifier device configured to amplify an input signal and provide such as an output signal, the second amplifier device comprising a second control input configured to receive the control signal to adjust a gain factor of the second amplifier device; and
    a control device operably coupled to the second amplifier device and configured to derive an effective gain factor of the second amplifier device as a function of the second amplifier device output signal and the control signal, and further comprising a control output coupled to the first and the second control input to provide the control signal as a function of a desired gain factor and the effective gain factor.

2. The amplifier arrangement of claim 1, wherein the second amplifier device comprises a scaled version of the first amplifier device or has the substantially same structure as the first amplifier device.

3. The amplifier arrangement of claim 1, wherein the control device comprises:
    a signal generator coupled to a signal input of the second amplifier device, and configured to provide the input signal;
    an analog-digital-converter coupled to a signal output of the second amplifier device, and configured to measure the output signal; and
    an adjustment device configured to calculate the effective gain factor of the second amplifier device and adapt the control signal as a function of the calculated effective gain factor and the desired gain factor.

4. The amplifier arrangement of claim 1, wherein the second amplifier device comprises a differential amplifier with a control input that forms the control input of the second amplifier device, a signal input and a signal output that are coupled to the control device that is configured to derive the effective gain factor, wherein the input signal comprises a differential signal comprising an input signal difference, and the output signal comprises a differential signal comprising an output signal difference, and wherein the control device is configured to employ the input signal difference and the output signal difference in deriving the effective gain factor.

5. The amplifier arrangement of claim 1, wherein the first and the second amplifier device each comprise a cascode stage, and wherein the control device is configured to provide the control signal as a cascode voltage to control the cascode stage of the respective first and second amplifier device.

6. The amplifier arrangement of claim 1, wherein the control signal comprises a signal that determines an operating point of a transistor associated with the respective first and second amplifier device.

7. The amplifier arrangement of claim 1, wherein the first and second amplifier device each comprise a plurality of switchable transistors configured to be independently switched on or off as a function of the control signal that comprises a digital control word.

8. The amplifier arrangement of claim 1, wherein the control device is configured to provide the control signal to a further amplifier device to control a gain of the further amplifier device.

9. An amplifier arrangement with controllable gain, comprising:
    a first amplifier device configured to amplify an input signal based on a gain factor thereof, comprising a first control input, a first signal input, and a first signal output;
    a second amplifier device comprising a second control input, a second signal input, and a second signal output, and configured to amplify an input signal at the second signal input and provide such an output signal at the second signal output; and
    a control device configured to adjust a control signal at the second control input as a function of an output signal difference of the output signal in response to an input signal difference of the input signal, and wherein the control device is configured to provide the adjusted control signal to the first control input.

10. The amplifier arrangement of claim 9, wherein the second amplifier device comprises a scaled version of the first amplifier device or comprise substantially the same structure as the first amplifier device.

11. The amplifier arrangement of claim 9, wherein the control device is configured to adjust the control signal as a function of a desired output signal difference.

12. The amplifier arrangement of claim 9, wherein the control device comprises:
    a signal generator coupled to the second signal input;
    an analog-digital-converter coupled to the second signal output and configured to measure the output signal; and
    an adjustment device configured to calculate an effective gain factor of the second amplifier device and adapt the control signal as a function of the effective gain factor and a desired gain factor.

13. The amplifier arrangement of claim 9, wherein the second amplifier device comprises a first amplifier unit and a second amplifier unit, each comprising a scaled version of the first amplifier device, and each comprising a signal input, a signal output and a control input which form the second control input, wherein a signal difference between a signal at the signal input of the first and the second amplifier unit corresponds to the input signal difference and the respective signal outputs of the first and the second amplifier unit are coupled to the control device to determine the output signal difference.

14. The amplifier arrangement of claim 9, wherein the first and the second amplifier device each comprise a cascode stage, and the control device is configured to provide the control signal comprising a cascode voltage for the respective first and second amplifier device.

15. The amplifier arrangement of claim 9, wherein the control device is configured to provide the control signal comprising a signal that determines an operating point of a transistor of the respective first and second amplifier device.

16. The amplifier arrangement claim 9, wherein the first and second amplifier device each comprise a plurality of switchable transistors configured to be independently switched on or off as a function of the control signal which comprises a digital control word.

17. The amplifier arrangement of claim 9, wherein the input signal of the second amplifier device is provided as a function of an effective operating point of the first amplifier device.

18. An amplifier arrangement with controllable gain, comprising:
    a first amplifier device configured to amplify an input signal based on a control signal, comprising a first control input and a signal transistor coupled to a first signal input;
    a second amplifier device comprising a first amplifier unit and a second amplifier unit, each amplifier unit comprising a scaled version of the first amplifier device, and each comprising a signal input and a control input; and
    a control device configured to provide a first input signal to the signal input of the first amplifier unit and a second input signal that differs from the first input signal by an input signal difference to the signal input of the second amplifier unit, and further comprising a comparator device configured to adjust the control signal at the first control input and the respective control inputs of the first and the second amplifier units as a function of a comparison of an output signal difference of output signals of the first and the second amplifier unit with a desired output signal difference.

19. The amplifier arrangement of claim 18, wherein the first amplifier device, the first amplifier unit and the second amplifier unit each comprise a cascode stage and the control device is configured to provide the control signal comprising a cascode voltage for the respective cascode stages of the first amplifier device, the first amplifier unit and the second amplifier unit.

20. The amplifier arrangement of claim 18, wherein the input signals of the first and the second amplifier unit are provided as a function of an effective operating point of the first amplifier device.

21. A method for controlling an amplifier gain, comprising:
    amplifying an auxiliary input signal depending on a control signal and outputting the amplified signal as an auxiliary output signal;
    measuring an effective gain factor associated with the amplification as a function of the auxiliary input signal and the auxiliary output signal;
    adapting the control signal as a function of the effective gain factor and a desired gain factor; and
    amplifying a main input signal based on the adapted control signal.

22. The method of claim 21, wherein amplifying the auxiliary input signal and measuring the effective gain factor comprise:
    amplifying a first input signal during a first period;
    amplifying a second input signal which differs from the first input signal by an input signal difference during a second period;
    measuring a first output signal during the first period and a second output signal during the second period;
    determining an output signal difference between the first and the second output signal; and
    determining the effective gain factor based on the input signal difference and the output signal difference.

23. The method of claim 21, wherein amplifying the auxiliary input signal and measuring the effective gain factor comprise:
    concurrently amplifying a first input signal to form a first output signal and amplifying a second input signal which differs from the first input signal by an input signal difference to form a second output signal;
    determining an output signal difference between the first and the second output signals; and
    determining the effective gain factor from the input signal difference and the output signal difference.

24. The method of claim 21, wherein the control signal comprises a digital control word.

25. A method for controlling an amplifier gain, comprising:
    amplifying an auxiliary input signal based on a control signal and outputting the amplified signal as an auxiliary output signal;
    varying the auxiliary input signal by an input signal difference;
    measuring a resulting output signal difference of the auxiliary output signal based on the input signal difference;
    adjusting the control signal as a function of the measured output signal difference and a desired output signal difference; and
    amplifying a main input signal based on the adjusted control signal.

26. The method of claim 25, wherein varying the auxiliary input signal comprises providing a first input signal during a first period and providing a second input signal which differs from the first input signal by the input signal difference during a second period, and wherein measuring the resulting output signal difference comprises measuring a first output signal during the first period and a second output signal during the second period, and determining the output signal difference between the first output signal and the second output signal.

27. The method of claim 25, wherein amplifying and varying the auxiliary input signal comprise concurrently amplifying a first input signal to form a first output signal and amplifying a second input signal which differs from the first input signal by the input signal difference to form a second output signal, and measuring the resulting output signal difference comprises concurrently measuring the first and the second output signals and determining the output signal difference between the first output signal and the second output signal.

28. The method of claim 25, wherein the auxiliary input signal is a function of an effective operating point of the amplification of the main input signal.

29. The method of claim 25, wherein the control signal comprises a digital control word.

30. The method of claim 29, wherein amplifying the main input signals comprises independently switching on or off a plurality of switchable transistors based on the digital control word.

31. The method of claim 29, wherein amplifying the main input signals comprises controlling a gain of an amplifier device in discrete steps based on the digital control word.

* * * * *